(12) United States Patent
Notohardjono et al.

(10) Patent No.: US 11,518,368 B2
(45) Date of Patent: Dec. 6, 2022

(54) DYNAMIC CENTER OF GRAVITY MONITORING AND TILT PREVENTION

(71) Applicant: INTERNATIONAL BUSINESS MACHINES CORPORATION, Armonk, NY (US)

(72) Inventors: Budy Notohardjono, Poughkeepsie, NY (US); Suraush Khambati, Poughkeepsie, NY (US); Shawn Canfield, Poughkeepsie, NY (US); Richard M. Ecker, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 66 days.

(21) Appl. No.: 16/984,791

(22) Filed: Aug. 4, 2020

(65) Prior Publication Data
US 2022/0041158 A1     Feb. 10, 2022

(51) Int. Cl.
*B60W 30/04* (2006.01)
*B62D 6/00* (2006.01)
(Continued)

(52) U.S. Cl.
CPC .......... *B60W 30/04* (2013.01); *B60W 40/13* (2013.01); *B62D 6/00* (2013.01); *G06F 30/27* (2020.01);
(Continued)

(58) Field of Classification Search
CPC ............. B60W 30/04; B60W 40/13; B60W 2040/1315; B60W 2520/06;
(Continued)

(56) References Cited

U.S. PATENT DOCUMENTS

| 4,511,974 A | 4/1985 | Nakane et al. |
| 6,385,518 B1 | 5/2002 | Rickers et al. |

(Continued)

FOREIGN PATENT DOCUMENTS

| CN | 202729702 U | 2/2013 |
| CN | 203699123 U | 7/2014 |

(Continued)

OTHER PUBLICATIONS

Mell et al., "The NIST Definition of Cloud Computing", Recommendations of the National Institute of Standards and Technology, NIST Special Publication 800-145, Sep. 2011, 7 pages.

(Continued)

*Primary Examiner* — Jeff A Burke
*Assistant Examiner* — Sihar A Karwan
(74) *Attorney, Agent, or Firm* — Robert D. Bean

(57) ABSTRACT

According to one embodiment, a method, computer system, and computer program product for preventing tipping of a load during transport by a vehicle is provided. The present invention may include retrieving a tipping point of the load, based on a center of gravity of the load, a speed of the vehicle, and a turning radius of the vehicle, wherein the tipping point is based on a simulation utilizing finite element analysis; and responsive to determining that the center of gravity of the load is within a threshold distance of the tipping point, taking a corrective action which may include controlling the speed or turning radius of the vehicle.

17 Claims, 8 Drawing Sheets

(51) Int. Cl.
*B60W 40/13* (2012.01)
*G06F 30/27* (2020.01)

(52) U.S. Cl.
CPC . *B60W 2040/1315* (2013.01); *B60W 2520/06* (2013.01); *B60W 2520/10* (2013.01); *B60W 2520/18* (2013.01); *B60W 2530/10* (2013.01); *B60W 2710/207* (2013.01); *B60W 2720/10* (2013.01)

(58) Field of Classification Search
CPC ......... B60W 2520/10; B60W 2520/18; B60W 2530/10; B60W 2710/207; B60W 2720/10; B62D 6/00; G06F 30/27
See application file for complete search history.

(56) References Cited

U.S. PATENT DOCUMENTS

| | | | |
|---|---|---|---|
| 9,550,561 B1 | 1/2017 | Beckman et al. | |
| 2010/0204891 A1 | 8/2010 | Biggerstaff | |
| 2014/0039767 A1* | 2/2014 | Jensen | E02F 9/2079 701/50 |
| 2016/0297429 A1 | 10/2016 | Watts | |
| 2018/0162410 A1* | 6/2018 | Skillsater | B60W 50/14 |
| 2018/0222732 A1* | 8/2018 | Manzi | B66F 9/07559 |
| 2018/0229988 A1* | 8/2018 | Gault | B66F 9/24 |
| 2021/0094535 A1* | 4/2021 | Thompson | G01C 21/005 |

FOREIGN PATENT DOCUMENTS

| | | |
|---|---|---|
| CN | 108297875 A | 7/2018 |
| EP | 2218832 A3 | 5/2014 |
| KR | 20130086746 A | 8/2013 |
| WO | 2004069568 A1 | 9/2004 |
| WO | 2015098166 A1 | 7/2015 |

OTHER PUBLICATIONS

Brakepower, "Automotive from Center of Gravity to Ground", https://brakepower.com/help_abc_07_YCG_t.htm Last Update: Nov. 10, 2019, 2 pages.

Youtube, "Determining a Vehicle's Center of Gravity Height", https://www.youtube.com/watch?v=fBlsyVJVK0Q, Jun. 6, 2017, 2 pages.

Longacre Racing, "Center of Gravity Height", Technical Articles, http://www.longacreracing.com/technical-articles.aspx?item=42586, printed on Jan. 17, 2020, 5 pages.

* cited by examiner

DYNAMIC CENTER OF GRAVITY MONITORING AND TILT PREVENTION

BACKGROUND

The present invention relates, generally, to the field of computing, and more particularly to computer-assisted load handling.

In our increasingly global world, the volume of shipped goods is unimaginably large, and all of it must be loaded onto ships and trucks, maneuvered around warehouses, placed into and withdrawn from storage locations, et cetera. As such, a commensurately massive amount of time and effort is spent handling these goods. Inevitably, transporting loads can come with challenges; loads may be prone to tipping, especially where the load has a high center of gravity or has a non-uniform or asymmetric distribution of mass. Consequently, methods of improving handling of loads during transport to reduce tipping have the potential to increase the safety of workers and goods, and realize potentially massive cumulative benefits in efficiency.

SUMMARY

According to one embodiment, a method, computer system, and computer program product for preventing tipping of a load during transport by a vehicle is provided. The present invention may include retrieving a tipping point of the load, based on a center of gravity of the load, a speed of the vehicle, and a turning radius of the vehicle, wherein the tipping point is based on a simulation utilizing finite element analysis; and responsive to determining that the center of gravity of the load is within a threshold distance of the tipping point, taking a corrective action which may include controlling the speed or turning radius of the vehicle.

BRIEF DESCRIPTION OF THE SEVERAL VIEWS OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

DETAILED DESCRIPTION

Figure 1:
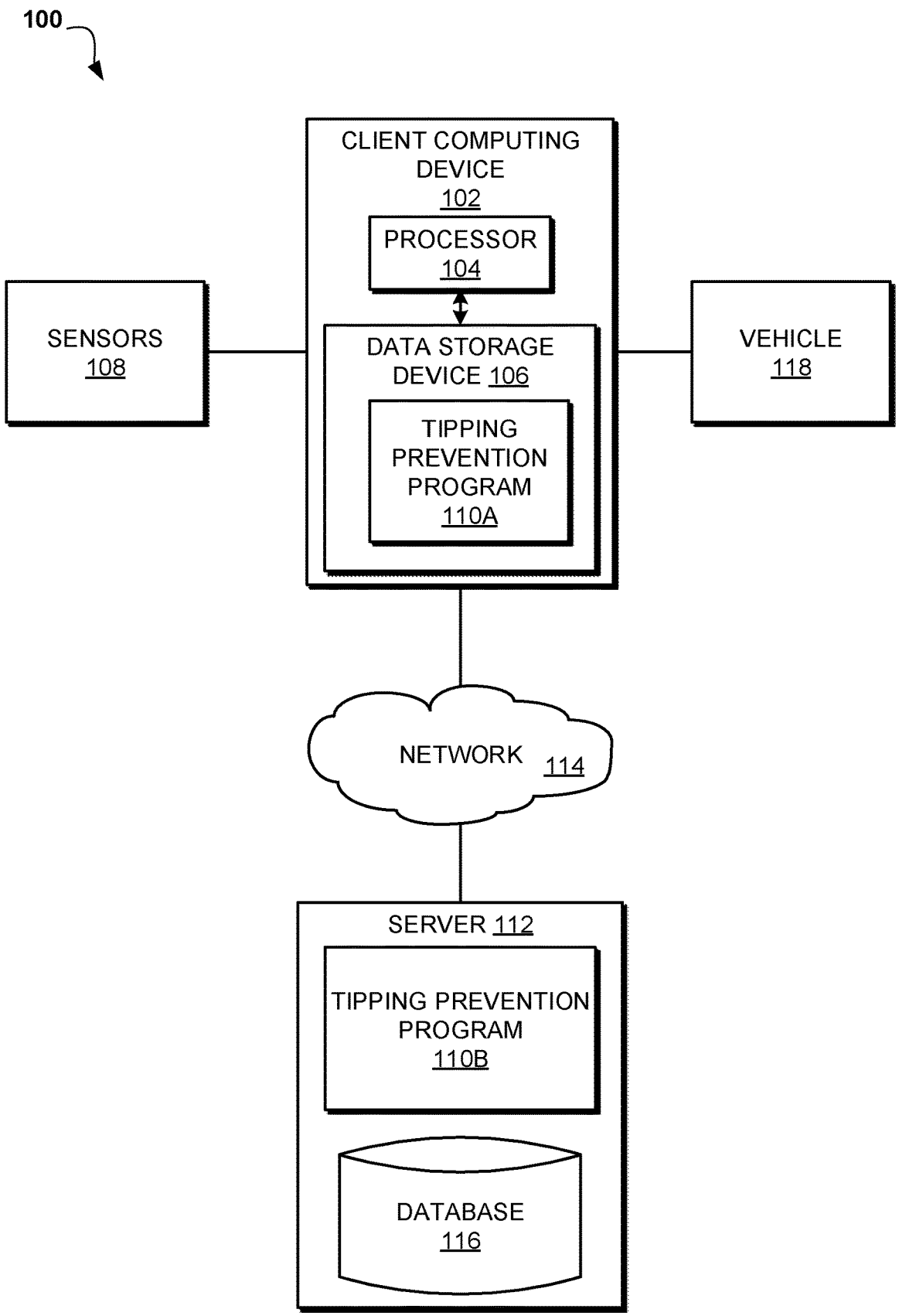
FIG. 1 illustrates an exemplary networked computer environment according to at least one embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

Embodiments of the present invention relate to the field of computing, and more particularly to computer-assisted load handling. The following described exemplary embodiments provide a system, method, and program product to, among other things, dynamically monitoring the center of gravity of a load, and modifying the speed or turning radius by which the load is transported to prevent tilt. Therefore, the present embodiment has the capacity to improve the technical field of computer-assisted load handling by preventing loads from exceeding their tipping point and falling over during transport, and allowing workers to travel closer to the speed and sharpness of turn that would result in tipping without exceeding them, thereby increasing speed and efficiency when handling loads.

As previously described, the volume of shipped goods is unimaginably large, and all of it must be loaded onto ships and trucks, maneuvered around warehouses, placed into and withdrawn from storage locations, et cetera. As such, a commensurately massive amount of time and effort is spent handling these goods. Inevitably, transporting loads can come with challenges; loads may be prone to tipping, especially where the load has a high center of gravity or has a non-uniform or asymmetric distribution of mass. For example, computer mainframes are tall, narrow loads with a high and off-center center of gravity, and are especially prone to tipping during transport. However, for loads with abnormal mass distribution, the center of gravity cannot be accurately ascertained by an observer without actually observing the load in motion; consequently, it is easy to inadvertently transport a load at a speed or turning radius that exceeds the tipping point of the load. Tipping poses a danger to the workers transporting the load, as well as a risk of potentially expensive damage to equipment and the load itself. In response, workers may compensate by moving the load far slower and/or at more generous turning radii than necessary, slowing down the speed and efficiency at which the load is transported.

Attempts to solve the tipping issue have been made. For example, some attempted solutions attempt to model the tipping point of a transported load using idealized computed or hand calculations; these idealized calculations do not take into account the shape of the load and the contact or physical interaction between the load and the foundation into account. For instance, idealized calculations might take into account the measured center of gravity and computing the outward centrifugal force less the frictional force between the load and the pallet to measure tip-over; this method cannot account for the space between the forks of a forklift and the pallet, or their bounding contact or stoppage. Other solutions have been attempted using multi-body dynamics. However, multi-body dynamics assumes that the foundation is rigid, and does not account for compressible bodies;

consequently, where the load is resting on a pallet made of wood or rubber, such a system may show no tip-over even if the load is in fact tipping over due to the flexion of the pallet. Other attempted solutions model tipping of the vehicle while carrying the load, and do not model the load by itself with respect to the vehicle. Consequently, these solutions do not account for motion and contact between the load and the vehicle, and do not model the tipping of the load itself. As such, it may be advantageous to, among other things, implement a system that automatically monitors the center of gravity of a load while the load is being transported on a vehicle, taking into account compression of deformable objects and interaction between objects such as the load, foundation, and vehicle, and limits the speed and/or turning radius of the vehicle to prevent the load from tipping.

According to at least one embodiment, the invention may be a system for dynamically monitoring the center of gravity of a load during transport by a vehicle, and limiting the speed and/or turning radius of the vehicle to prevent tipping or tilting.

In some embodiments, the system may compare the center of gravity of the load against a database of tipping points based on mass, center of gravity, speed, and turning radius to determine a safe zone of operation for the vehicle. The safe zone of operation may be the various combinations of speeds and turning radii at which the load will not tilt or tip over.

In some embodiments, the database of tipping points may be generated by finding the center of gravity using computer-aided design software, simplifying the model, setting up finite element analysis runs, setting up inputs for different turning radii and speeds, determining the tipping point, creating a two-dimensional plot for a given height of a center of gravity, creating a three-dimensional plot for a given mass range, and repeating for the entire range of mass that the vehicle can lift or transport.

In some embodiments, the system may employ four load cells measuring the downward force exerted by the load to dynamically compute the center of gravity of the load. In some embodiments, the load cells may be mounted to the pallet, the load, or the vehicle. In some embodiments, the system may employ four load cells, arranged to describe a rectangle.

As used herein, the load may be any item or object being transported by a vehicle. The foundation may be any structure upon which the load rests that is independent from the load and the vehicle, such as a pallet, flat piece of plywood, et cetera.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The following described exemplary embodiments provide a system, method, and program product to dynamically monitoring the center of gravity of a load, and modifying the speed or turning radius by which the load is transported to prevent tilt.

Referring to FIG. 1, an exemplary networked computer environment 100 is depicted, according to at least one embodiment. The networked computer environment 100 may include client computing device 102 and a server 112 interconnected via a communication network 114. According to at least one implementation, the networked computer environment 100 may include a plurality of client computing devices 102 and servers 112, of which only one of each is shown for illustrative brevity.

The communication network 114 may include various types of communication networks, such as a wide area network (WAN), local area network (LAN), a telecommunication network, a wireless network, a public switched network and/or a satellite network. The communication network 114 may include connections, such as wire, wireless communication links, or fiber optic cables. It may be appreciated that FIG. 1 provides only an illustration of one implementation and does not imply any limitations with regard to the environments in which different embodiments may be implemented. Many modifications to the depicted environments may be made based on design and implementation requirements.

Client computing device 102 may include a processor 104 and a data storage device 106 that is enabled to host and run a tipping prevention program 110A and communicate with the server 112 via the communication network 114, in accordance with one embodiment of the invention. Client computing device 102 may be, for example, a mobile device, a telephone, a personal digital assistant, a netbook, a laptop computer, a tablet computer, a desktop computer, or any type of computing device capable of running a program and accessing a network. As will be discussed with reference to FIG. 6, the client computing device 102 may include internal components 602a and external components 604a, respectively. In some embodiments, client computing device 102 may be integrated into vehicle 118, for example where vehicle 118 is a smart forklift with an onboard computer. In some embodiments, client computing device 102 may be equipped with a graphical user interface to display warnings or status updates to a user that were sent or triggered by tipping prevention program 110A, 110B.

The server computer 112 may be a laptop computer, netbook computer, personal computer (PC), a desktop computer, or any programmable electronic device or any network of programmable electronic devices capable of hosting and running a tipping prevention program 110B and a database 116 and communicating with the client computing device 102 via the communication network 114, in accordance with embodiments of the invention. As will be discussed with reference to FIG. 6, the server computer 112 may include internal components 602b and external components 604b, respectively. The server 112 may also operate in a cloud computing service model, such as Software as a Service (SaaS), Platform as a Service (PaaS), or Infrastructure as a Service (IaaS). The server 112 may also be located in a cloud computing deployment model, such as a private cloud, community cloud, public cloud, or hybrid cloud.

Sensors 108 may be any instruments capable of recording data and communicating the data to tipping prevention program 110A, 110B. For instance, the sensors 108 may be any instrument capable of measuring the downward force exerted by a load in real-time or near-real-time, such as load cells or weighing scales. The sensors 108 may also include any instrument capable of directly or indirectly measuring the speed and/or turning radius of the load or vehicle 118, such as an accelerometer, gyroscope, speedometer, et cetera. Sensors 108 may be connected via hardline or wireless network 114 to client computing device 102 or server 112, such that the sensors 108 are in communication with tipping prevention program 110A, 110B.

Vehicle 118 may be any instrumentality for transporting the load where the speed and turning radius of the instrumentality may create a risk of tipping for the load. While embodiments of the invention are presented mostly in reference to forklifts, one skilled in the art would understand aspects of the invention to apply to any means of transporting an unsecured load where tipping is undesirable. For example, vehicle 118 may be a forklift, loader, pickup truck, handcart, piano dolly, ship, semi-trailer, et cetera. In some embodiments, vehicle 118 may be capable of communicating with client computing device 102 or server 112, and may communicate information such as its speed at a given moment, the angle at which it is currently turning or being ordered to turn, and/or information identifying the make/model of the vehicle 118 or the extent of the vehicle 118's capabilities. In some embodiments, vehicle 118 may be equipped with a user interface capable of conveying warnings or status updates to a user triggered or sent by tipping prevention program 110A, 110B. In some embodiments, vehicle 118 may be enabled to receive and execute commands from tipping prevention program 110A, 110B, for instance commands to limit or reduce the current speed and/or turning radius of vehicle 118.

According to the present embodiment, database 116 may be a compilation of data including the tipping points of various loads at a range of masses, center of gravity heights, speeds, and turning radii. Database 116 may be one or more physical storage devices, or may be a logical structure within one or more physical storage devices. In some embodiments, the database 116 may include a profile for a variety of vehicles 118, containing vehicle data such as the type (forklift, truck, loader) shape, speed, turning radius, width, wheelbase, et cetera. The creation of the database 116 is explained in greater detail below with respect to FIG. 5.

According to the present embodiment, the tipping prevention program 110A, 110B may be a program capable of dynamically monitoring the center of gravity of a load, and modifying the speed or turning radius by which the load is transported to prevent tipover. The tipping prevention may be located on client computing device 102 or server 112 or on any other device located within network 114. Furthermore, tipping prevention may be distributed in its operation over multiple devices, such as client computing device 102 and server 112. The tipping prevention method is explained in further detail below with respect to FIG. 2.

Figure 2:
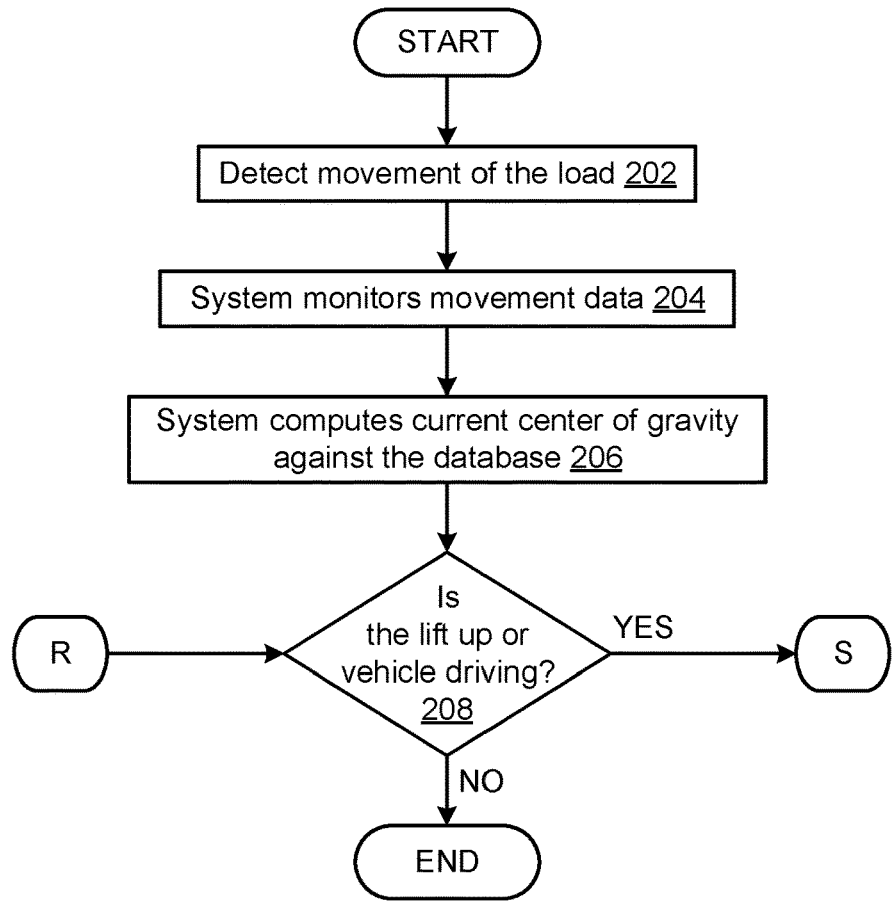
FIG. 2 is an operational flowchart illustrating a tipping prevention process according to at least one embodiment.

Referring now to FIG. 2, an operational flowchart illustrating a tipping prevention process 200 is depicted according to at least one embodiment. At 202, the tipping prevention program 110A, 110B detects movement of the load. In some embodiments, the tipping prevention program 110A, 110B may detect whether the load is moving based on data from sensors 108 or from vehicle 118. For example, tipping prevention program 110A, 110B may infer movement from load scale data, such as where the distribution of stress on the different load scales indicates that a force is being exerted on the load. Tipping prevention program 110A, 110B may infer movement from an accelerometer, or receive speed data directly from the vehicle 118.

At 204, tipping prevention program 110A, 110B monitors movement data. The tipping prevention program 110A, 110B may monitor movement data from sensors 108, or from vehicle 118. Movement data may be any data relating to the current movement of the load and the location of its center of gravity, and the amount or degree to which the load or vehicle 118 is turning. For example, movement data may include readings from the load scales, speed data from an accelerometer, and/or turning radius data from a gyroscope. The tipping prevention program 110A, 110B may monitor the movement data in real time or near-real-time, such that the interval between instances of movement data collection is small enough that there is time for corrective action to be taken should the center of gravity reach or approach a tipping point.

At 206, tipping prevention program 110A, 110B computes the current center of gravity against the database 116. The tipping prevention program 110A, 110B may compute the center of gravity in real time based on the movement data from sensors 108, and may communicate with the database 116 to locate the tipping point and the limiting speed of the vehicle 118 that corresponds with the computed center of gravity. The tipping prevention program 110A, 110B may use the following equation to compute the center of gravity:

$$CGH = \frac{WB \times FWc}{TW \times \tan\theta}$$

Where "CGH" is the center of gravity height, "WB" is the wheelbase, "FWc" is the difference between "FW1," which is the front weight level, and "FW2," which is the front weight raised (such as by a forklift), "TW" is the total weight, and where:

$$\tan\theta = \frac{HT}{Adj}$$

Here "HT" is height that the load is raised, and "Adj" is the adjacent side, which may be in turn described by the following equation:

$$Adj = \sqrt{WB^2 - HT^2}$$

The tipping prevention program 110A, 110B may find the center of gravity within the database 116, such as by consulting plots modelling tipping points at different ranges of mass and CG heights, and retrieve the tipping points corresponding with the center of gravity height, and potentially the mass range of the load. The plots are explained in greater detail below with respect to FIG. 5, particularly steps 510 and 512.

At 208, the tipping prevention program 110A, 110B determines whether the lift is up or the vehicle 118 is driving. The tipping prevention program 110A, 110B may detect whether the lift is up or the vehicle 118 is driving by communicating with the vehicle 118 to ascertain the vehicle's operational status, or by inferring based on data collected from sensors 108. For instance, tipping prevention program 110A, 110B may measure the height of the load via an infrared or laser rangefinder, a microlocation sensor, sonar, et cetera, attached to the load, the foundation, or on parts of the vehicle (such as on the forks of a forklift) 118. The lift may be an adjustable lifting surface of a vehicle 118 which may be raised or lowered. According to one implementation, if the tipping prevention program 110A, 110B determines that the lift is up or the vehicle 118 is driving (step 208, "YES" branch), the tipping prevention program 110A, 110B may continue to execute flowchart S, explained in greater detail in FIG. 3. If the tipping prevention program 110A, 110B determines that the lift is not up or that the vehicle 118 is not driving (step 208, "NO" branch), the tipping prevention program 110A, 110B may terminate.

Figure 3:
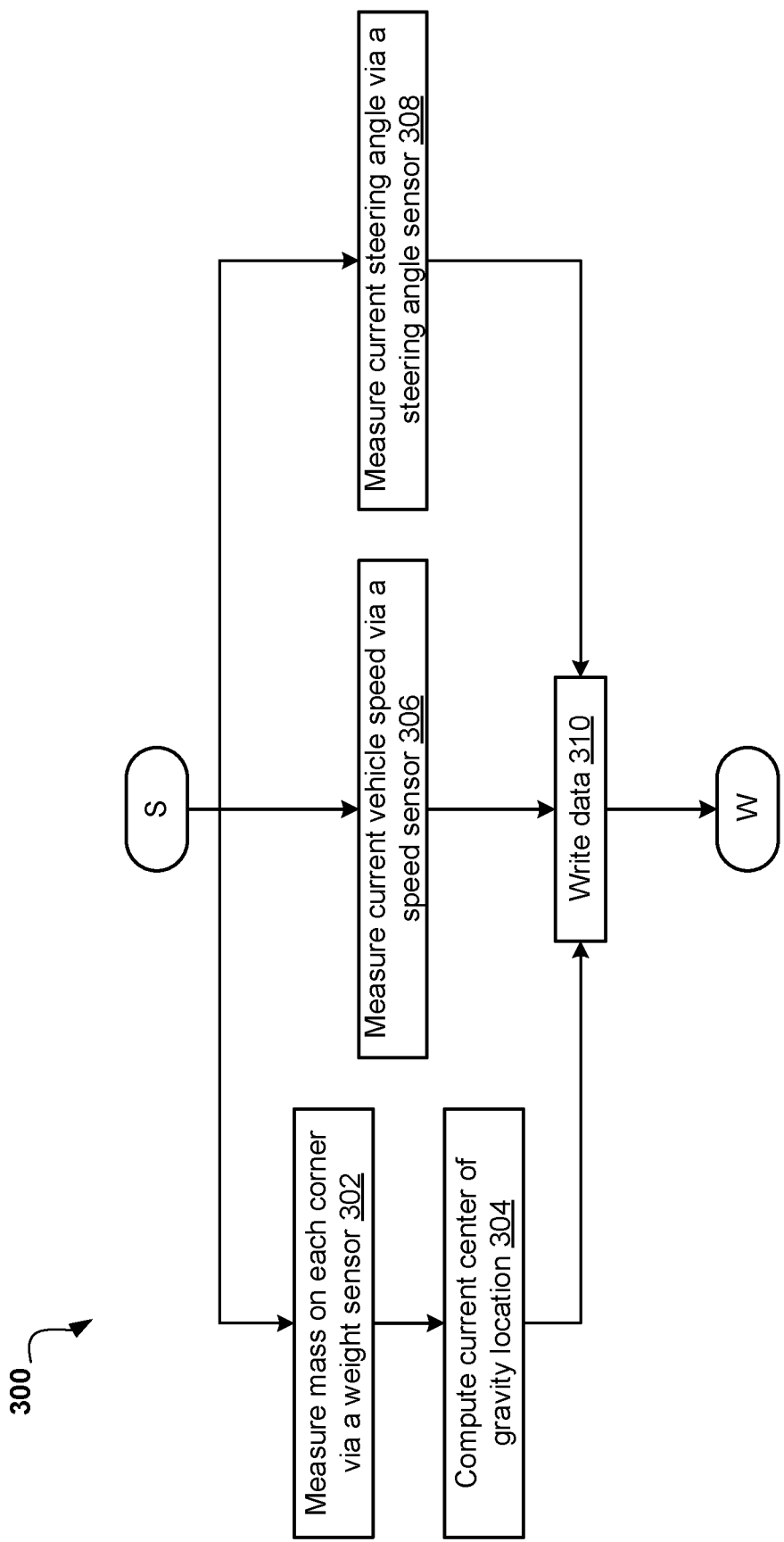
FIG. 3 is an operational flowchart illustrating a subroutine of the tipping prevention process according to at least one embodiment.

Referring now to FIG. 3, an operational flowchart illustrating a subprocess 300 of the tipping prevention process 200 is depicted according to at least one embodiment. At 302, tipping prevention program 110A, 110B measures the mass on each corner via a weight sensor. Here, tipping prevention program 110A, 110B may measure the mass, or downward force exerted by the load, by means of weight sensors or load scales located at points of a rectangle beneath the load, for instance at each corner of a pallet, or at the points and bases of the forks of a forklift.

At 304, tipping prevention program 110A, 110B computes the current center of gravity location. Here, tipping prevention program 110A, 110B utilizes a center of gravity formula to calculate where the center of gravity of the load is located within the load at the current time, for example as in step 206 of FIG. 2.

At 306, tipping prevention program 110A, 110B measures the current vehicle speed via a speed sensor. In some embodiments, tipping prevention program 110A, 110B may communicate with vehicle 118 to receive speed data, and may not utilize a speed sensor.

At 308, tipping prevention program 110A, 110B measures the current steering angle via a steering angle sensor. In some embodiments, tipping prevention program 110A, 110B may communicate with vehicle 118 to receive steering angle data, and may not utilize a steering angle sensor. The steering angle sensor may be any of sensors 108 capable of directly or indirectly measuring turning radius, such as an accelerometer, gyroscope, etc.

At 310, tipping prevention program 110A, 110B writes the data. Here, tipping prevention program 110A, 110B may write the data gathered by the sensors 108 and the calculated center of gravity of the load to database 116, to be used in, for instance, simulations of the load for purposes of calculating tipping points and the safe zone of operation for vehicle 118.

Figure 4:
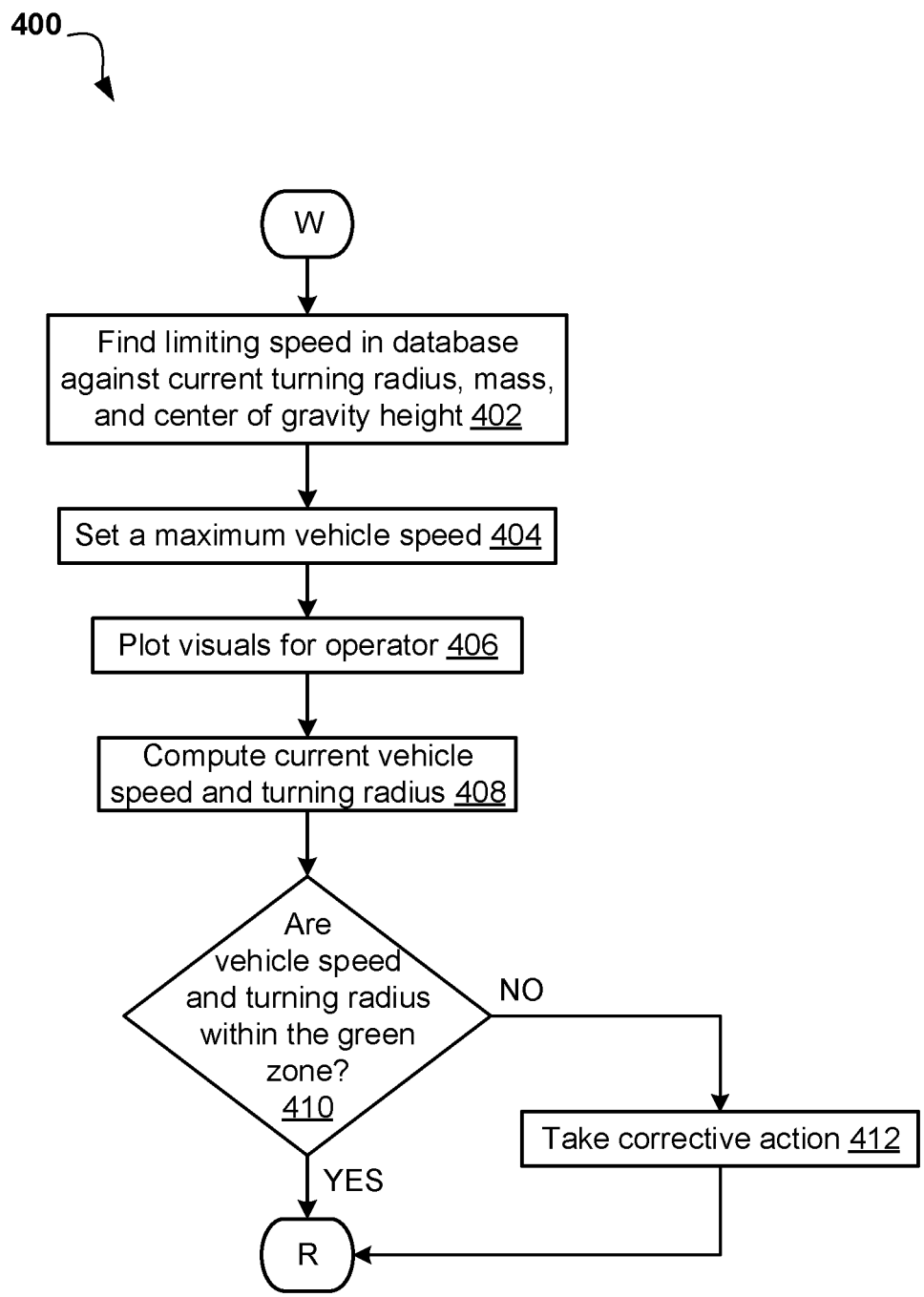
FIG. 4 is an operational flowchart illustrating a subroutine of the tipping prevention process according to at least one embodiment.

Referring now to FIG. 4, an operational flowchart illustrating a subprocess 400 of the tipping prevention process 200 is depicted according to at least one embodiment. At 402, tipping prevention program 110A, 110B finds the limiting speed in the database 116 against the current turning radius, mass, and center of gravity height. Here, tipping prevention program 110A, 110B consults the database 116 and finds the limiting speed, which may be the speed at which the load tips or tilts at a given turning radius of the vehicle 118. In some embodiments, machine learning may be utilized to increase the speed and efficiency of finding the limiting speed by employing a corpus of historical data and a machine learning algorithm to predict a limiting speed based on the past data. For example, if tipping prevention program 110A, 110B had recorded data in database 116 pertaining to past instances of transporting a load of similar mass, and/or on similar vehicles, tipping prevention program 110A, 110B may interpret that data via a machine learning algorithm to determine if the load tipped or tilted, which speeds and/or turning radii produced tilt or tipover, and/or which were safe and produced no tilt or tipover.

At 404, tipping prevention program 110A, 110B sets a maximum vehicle speed. The maximum vehicle speed may be a speed that vehicle 118 must not exceed going straight, and/or for each turning radius. The maximum vehicle speed may be at or just below the limiting speed, or it may be a predetermined lesser speed for a turning radius to provide a margin of error before the limiting speed is reached and the load reaches the point of tilt or tipover.

At 406, tipping prevention program 110A, 110B plots visuals for the operator. Here, tipping prevention program 110A, 110B may visually convey, for example using a graphical user interface, information pertaining to the tipping points or tilting points of the load. For example, the tipping prevention program 110A, 110B may pictorially represent the tilting or tipping danger at the limiting speed, or display the maximum vehicle speeds.

At 408, tipping prevention program 110A, 110B computes the current vehicle speed and turning radius, such as by consulting data from sensors 108, or receiving data from vehicle 118.

At 410, the tipping prevention program 110A, 110B determines whether the vehicle speed and turning radius of the load is within the green zone. The green zone may be the range of speeds and/or turning radii at which the load will not tip or tilt, and may also be referred to as the safe zone. The tipping prevention program 110A, 110B may measure the distance between the current center of gravity as calculated from the movement data against the tipping point received from the database 116. If tipping prevention program 110A, 110B identifies the center of gravity as within a threshold distance from the tipping point, where the threshold distance may be pre-supplied by a user or automatically and/or dynamically determined according to historical data and/or statistical analysis, then the load is within a "yellow zone" where the load is close enough to the tipping point that it is in danger of tipping. A center of gravity may be within the safe zone if it is outside the yellow zone, or threshold distance, from the tipping point. According to one implementation, if the tipping prevention program 110A, 110B determines that the tipping point is within the safe zone (step 208, "YES" branch), the tipping prevention program 110A, 110B may continue to R, displayed in FIG. 2. If the tipping prevention program 110A, 110B determines that the tipping point is not within the safe zone (step 208, "NO" branch), the tipping prevention program 110A, 110B continue to step 414 to take corrective action.

At 412, the tipping prevention program 110A, 110B may take corrective action. The corrective action may be any action that directly or indirectly limits the speed or turning radius of the load, such that the center of gravity does not reached the tipping point. The tipping prevention program 110A, 110B may take indirect corrective action by warning the operator; for example, in embodiments where the client computing device 102 is equipped with or in communication with a display, tipping prevention program 110A, 110B display a warning to the operator. The tipping prevention program 110A, 110B may warn the operator by other means, such as by flashing a light, emitting a noise, et cetera. In some embodiments, tipping prevention program 110A, 110B may act to directly limit the speed or turning radius of the load, by issuing commands to vehicle 118. For instance, tipping prevention program 110A, 110B may issue commands to reduce the speed or turning radius to vehicle 118 such that the vehicle 118 slows or increases the angle of its turn.

Figure 5:
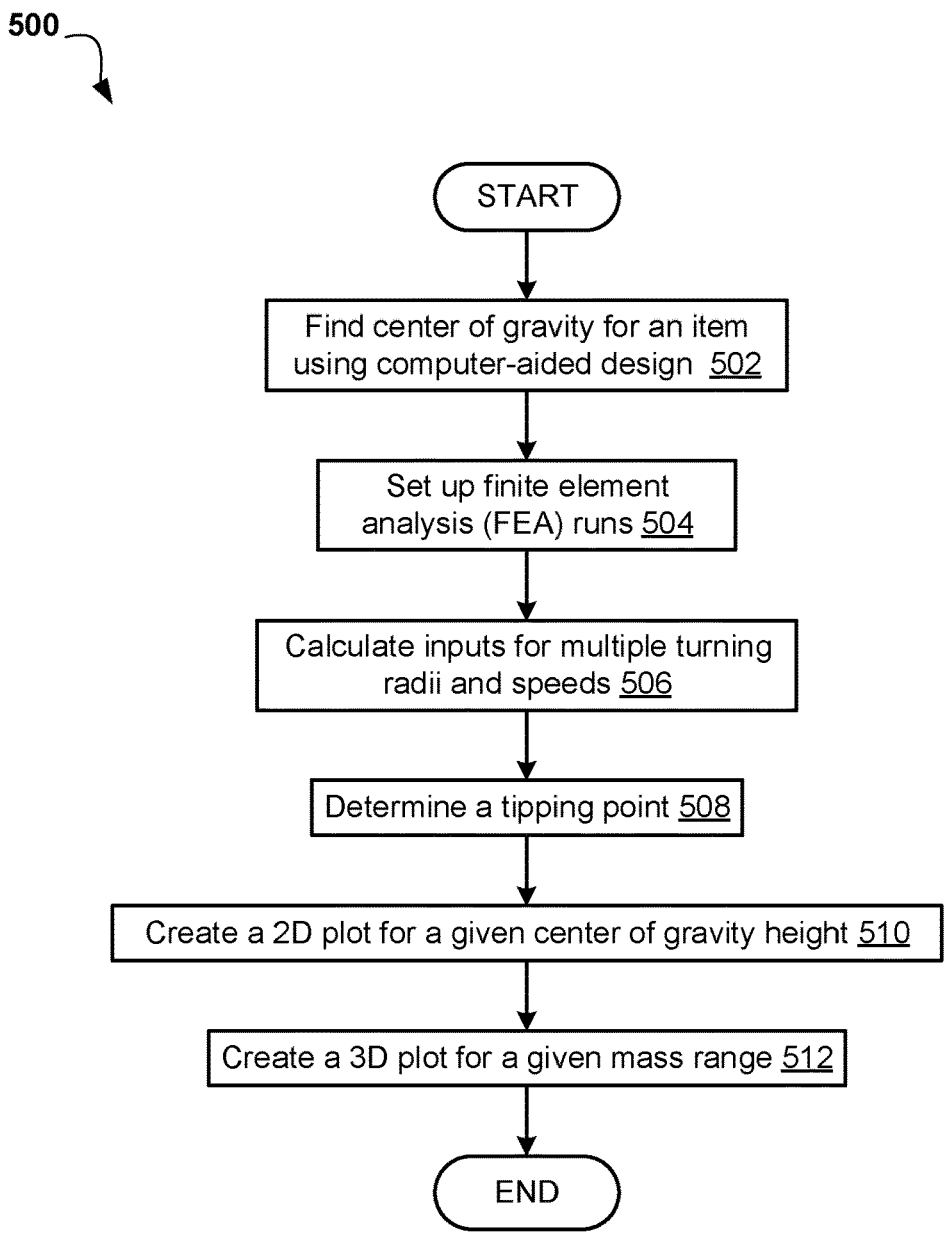
FIG. 5 is an operational flowchart illustrating a method of creating a database for a tipping prevention process according to at least one embodiment.

Referring now to FIG. 5, an operational flowchart illustrating a method 500 of creating a database 116 for a tipping prevention process 200 is depicted according to at least one embodiment. At 502, the tipping prevention program 110A, 110B may find the center of gravity for a load using computer-aided design. The tipping prevention program 110A, 110B may model the load and the foundation and compute the center of gravity based on, for instance, the volume, shape and mass of the load. The tipping prevention program 110A, 110B may simplify the model of the load to reduce the complexity of the simulation and therefore decrease the resources necessary to model the load without significantly sacrificing accuracy. In some embodiments, the tipping prevention program 110A, 110B may model a range of hypothetical loads outside of the context of transporting a load in real time, so that the models may be consulted as necessary when a load is being transported that matches a modeled load.

At 504, the tipping prevention program 110A, 110B may set up finite element analysis runs. The tipping prevention program 110A, 110B uses finite element analysis to prepare a simulation of the motion of the load, any foundation it might be resting on, and the vehicle 118. The finite element analysis assumes that the bodies involved are deformable, and simulates changes to the shapes of the bodies under stress. In some embodiments, tipping prevention program 110A, 110B may additionally utilize multi-body dynamic simulation, which models the bodies involved as rigid. The multi-body dynamic simulation may be used, for example, to simulate the motion of the bodies and identify parameters such as velocity, acceleration, and external loads, which could then be used as input for the finite element analysis to calculate the deformation of the bodies. The simulation may account for friction, slipping, flexing or contact resistance between the bodies involved, such as the vehicle 118, the load, and the foundation. Furthermore, the simulation may model a threshold surface, which may be the surface upon which the load rests such as the foundation or the vehicle, based upon the dimensions and material properties of the foundation or vehicle.

At 506, the tipping prevention program 110A, 110B may calculate inputs for multiple turning radii and speeds. Here, tipping prevention program 110A, 110B provides inputs for a range of turning radii and speeds to the simulation, which then models the movement of the bodies at each set of inputs. The tipping prevention program 110A, 110B may identify the vehicle 118, either by user input, direct communication with the vehicle 118, and/or by inference based on turning radius, speed, or other measured characteristics of the vehicle 118, and may choose a profile matching the vehicle 118 from the database 116. The tipping prevention program 110A, 110B may use the profile to model the vehicle 118 in the simulation. The tipping prevention program 110A, 110B may provide inputs for a range of turning radii and speeds to the simulation based on the vehicle profile; for instance, the tipping prevention program 110A, 110B may only model speeds and turning radii that the vehicle 118 is capable of executing.

At 508, the tipping prevention program 110A, 110B may calculate a tipping point. Here, tipping prevention program 110A, 110B may calculate, based on the simulation, a tipping point of the load at each input turning radius and speed. The tipping prevention program 110A, 110B may run the simulation and determine whether or not the load tips at a given speed and turning radius.

At 510, the tipping prevention program 110A, 110B may create a 2D plot for a given center of gravity height. The tipping prevention program 110A, 110B may run the simulation according to the input speeds and turning radii at a variety of center of gravity heights, and may plot the tipping points for each center of gravity on a graph. The tipping prevention program 110A, 110B may consult the 2D plot to identify a tipping point for a given input speed and turning radius of a load with a matching center of gravity height while the load is being transported.

At 512, the tipping prevention program 110A, 110B may create a 3D plot for a given mass range. The tipping prevention program 110A, 110B may run the simulation according to input speeds and turning radii at a variety of center of gravity heights at a given range of mass to produce a 3D plot. In some embodiments, tipping prevention program 110A, 110B may limit the range of mass of the load to masses that the vehicle 118 is capable of lifting or carrying based on the vehicle profile. The tipping prevention program 110A, 110B may consult the 3D plot to identify a tipping point for a given input speed and turning radius of a load with a matching center of gravity height and a matching mass while the load is being transported.

It may be appreciated that FIGS. 2-5 provides only illustrations of implementations and do not imply any limitations with regard to how different embodiments may be implemented. Many modifications to the depicted environments may be made based on design and implementation requirements.

Figure 6:
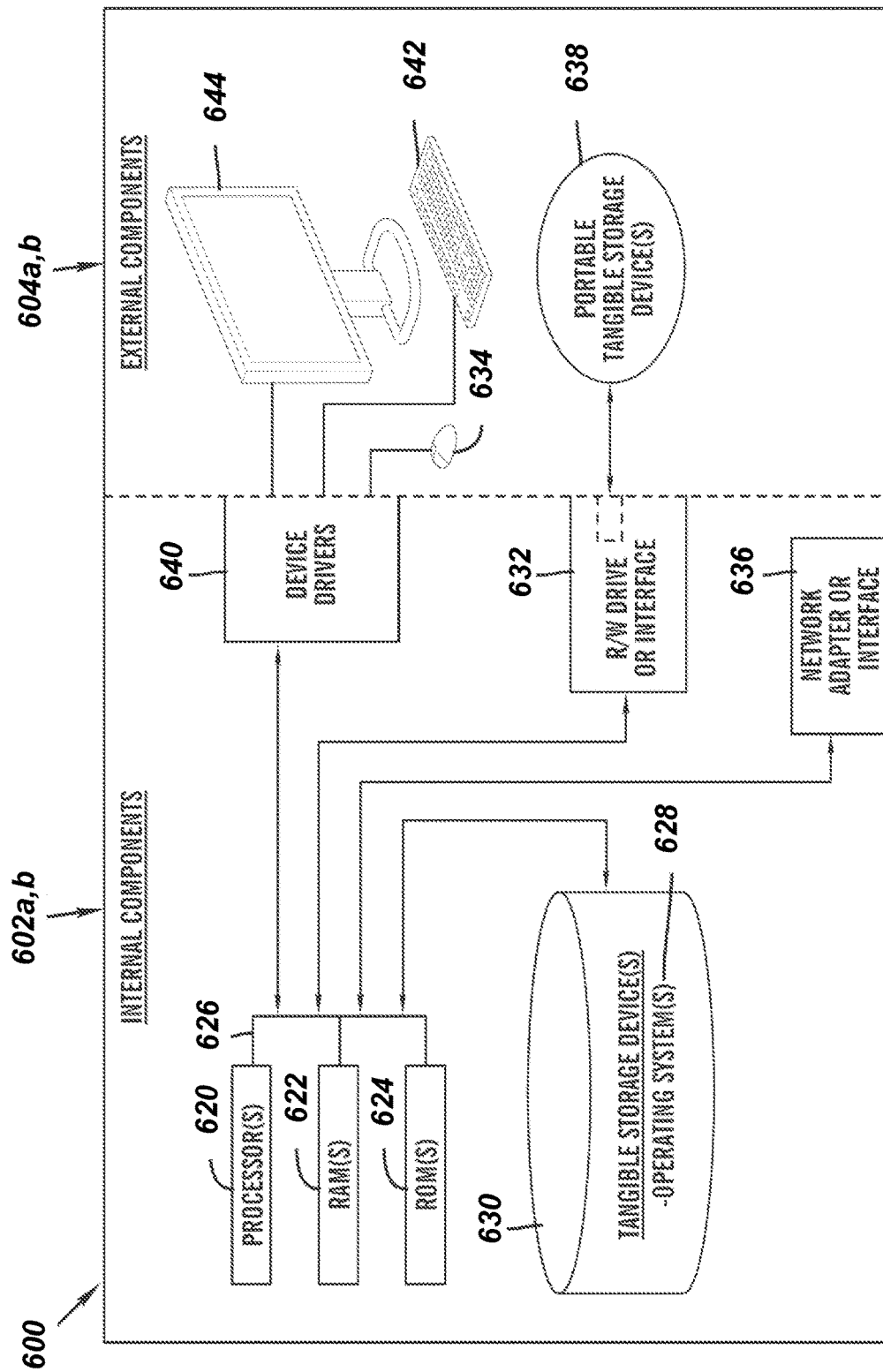
FIG. 6 is a block diagram of internal and external components of computers and servers depicted in FIG. 1 according to at least one embodiment.

FIG. 6 is a block diagram 600 of internal and external components of the client computing device 102 and the server 112 depicted in FIG. 1 in accordance with an embodiment of the present invention. It should be appreciated that FIG. 6 provides only an illustration of one implementation and does not imply any limitations with regard to the environments in which different embodiments may be implemented. Many modifications to the depicted environments may be made based on design and implementation requirements.

The data processing system 602, 604 is representative of any electronic device capable of executing machine-readable program instructions. The data processing system 602, 604 may be representative of a smart phone, a computer system, PDA, or other electronic devices. Examples of computing systems, environments, and/or configurations that may represented by the data processing system 602, 604 include, but are not limited to, personal computer systems, server computer systems, thin clients, thick clients, handheld or laptop devices, multiprocessor systems, microprocessor-based systems, network PCs, minicomputer systems, and distributed cloud computing environments that include any of the above systems or devices.

The client computing device 102 and the server 112 may include respective sets of internal components 602 *a,b* and external components 604 *a,b* illustrated in FIG. 6. Each of the sets of internal components 602 include one or more processors 620, one or more computer-readable RAMs 622, and one or more computer-readable ROMs 624 on one or more buses 626, and one or more operating systems 628 and one or more computer-readable tangible storage devices 630. The one or more operating systems 628, the tipping prevention program 110A in the client computing device 102 and the tipping prevention program 110B in the server 112 are stored on one or more of the respective computer-readable tangible storage devices 630 for execution by one or more of the respective processors 620 via one or more of the respective RAMs 622 (which typically include cache memory). In the embodiment illustrated in FIG. 6, each of the computer-readable tangible storage devices 630 is a magnetic disk storage device of an internal hard drive. Alternatively, each of the computer-readable tangible storage devices 630 is a semiconductor storage device such as ROM 624, EPROM, flash memory or any other computer-readable tangible storage device that can store a computer program and digital information.

Each set of internal components 602 *a,b* also includes a R/W drive or interface 632 to read from and write to one or more portable computer-readable tangible storage devices 638 such as a CD-ROM, DVD, memory stick, magnetic tape, magnetic disk, optical disk or semiconductor storage device. A software program, such as the tipping prevention program 110A, 110B, can be stored on one or more of the respective portable computer-readable tangible storage devices 638, read via the respective R/W drive or interface 632, and loaded into the respective hard drive 630.

Each set of internal components 602 *a,b* also includes network adapters or interfaces 636 such as a TCP/IP adapter cards, wireless Wi-Fi interface cards, or 3G or 4G wireless interface cards or other wired or wireless communication links. The tipping prevention program 110A in the client computing device 102 and the tipping prevention program 110B in the server 112 can be downloaded to the client computing device 102 and the server 112 from an external computer via a network (for example, the Internet, a local area network or other, wide area network) and respective network adapters or interfaces 636. From the network adapters or interfaces 636, the tipping prevention program 110A in the client computing device 102 and the tipping prevention program 110B in the server 112 are loaded into the respective hard drive 630. The network may comprise copper wires, optical fibers, wireless transmission, routers, firewalls, switches, gateway computers and/or edge servers.

Each of the sets of external components 604 *a,b* can include a computer display monitor 644, a keyboard 642, and a computer mouse 634. External components 604 *a,b* can also include touch screens, virtual keyboards, touch pads, pointing devices, and other human interface devices. Each of the sets of internal components 602 *a,b* also includes device drivers 640 to interface to computer display monitor 644, keyboard 642, and computer mouse 634. The device drivers 640, R/W drive or interface 632, and network adapter or interface 636 comprise hardware and software (stored in storage device 630 and/or ROM 624).

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 7:
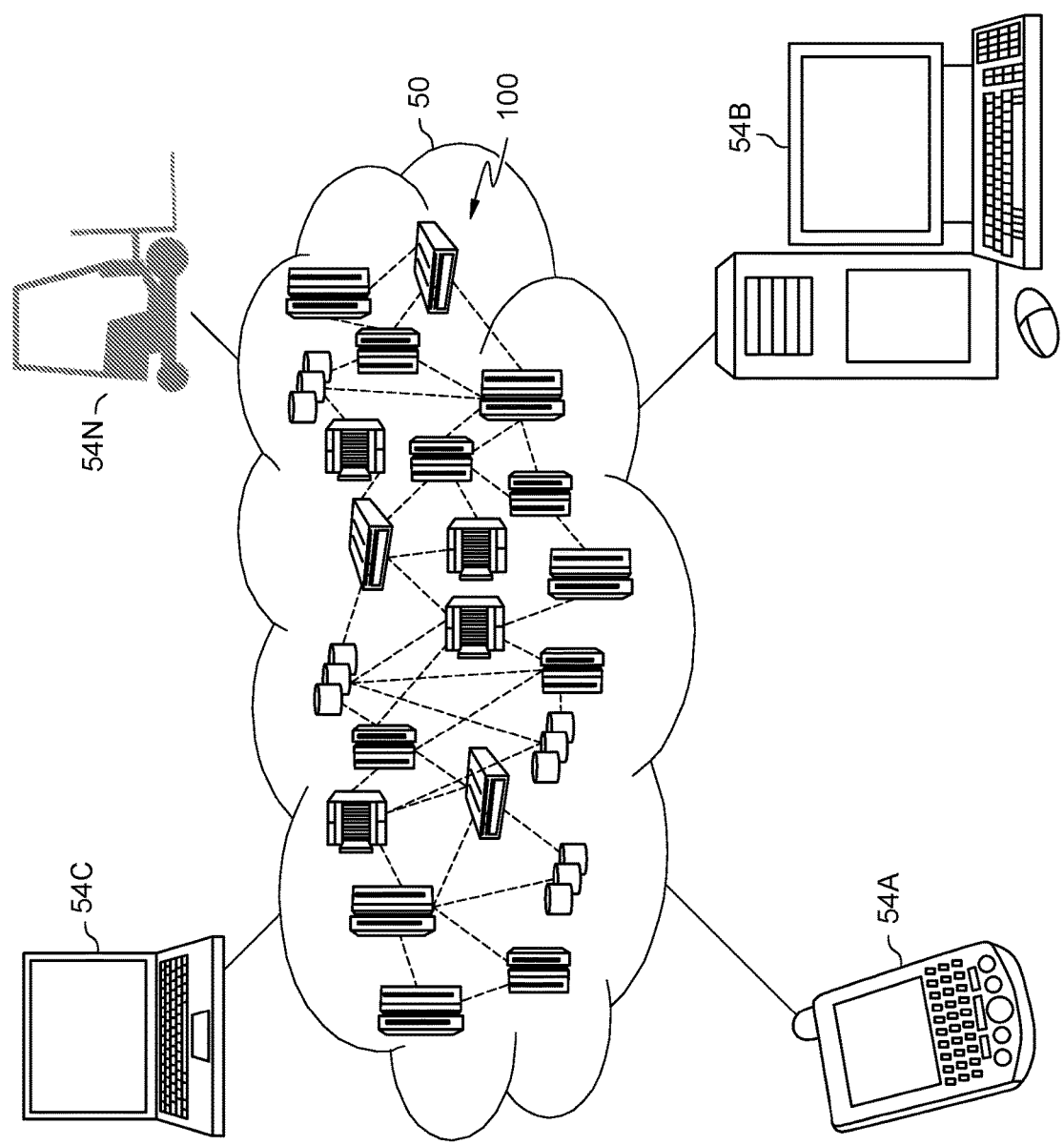
FIG. 7 depicts a cloud computing environment according to an embodiment of the present invention.

Referring now to FIG. 7, illustrative cloud computing environment 50 is depicted. As shown, cloud computing environment 50 comprises one or more cloud computing nodes 100 with which local computing devices used by cloud consumers, such as, for example, personal digital assistant (PDA) or cellular telephone 54A, desktop computer 54B, laptop computer 54C, and/or automobile computer system 54N may communicate. Nodes 100 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 7 are intended to be illustrative only and that computing nodes 100 and cloud computing environment 50 can communicate with any type of computerized device over any type of network and/or network addressable connection (e.g., using a web browser).

Figure 8:
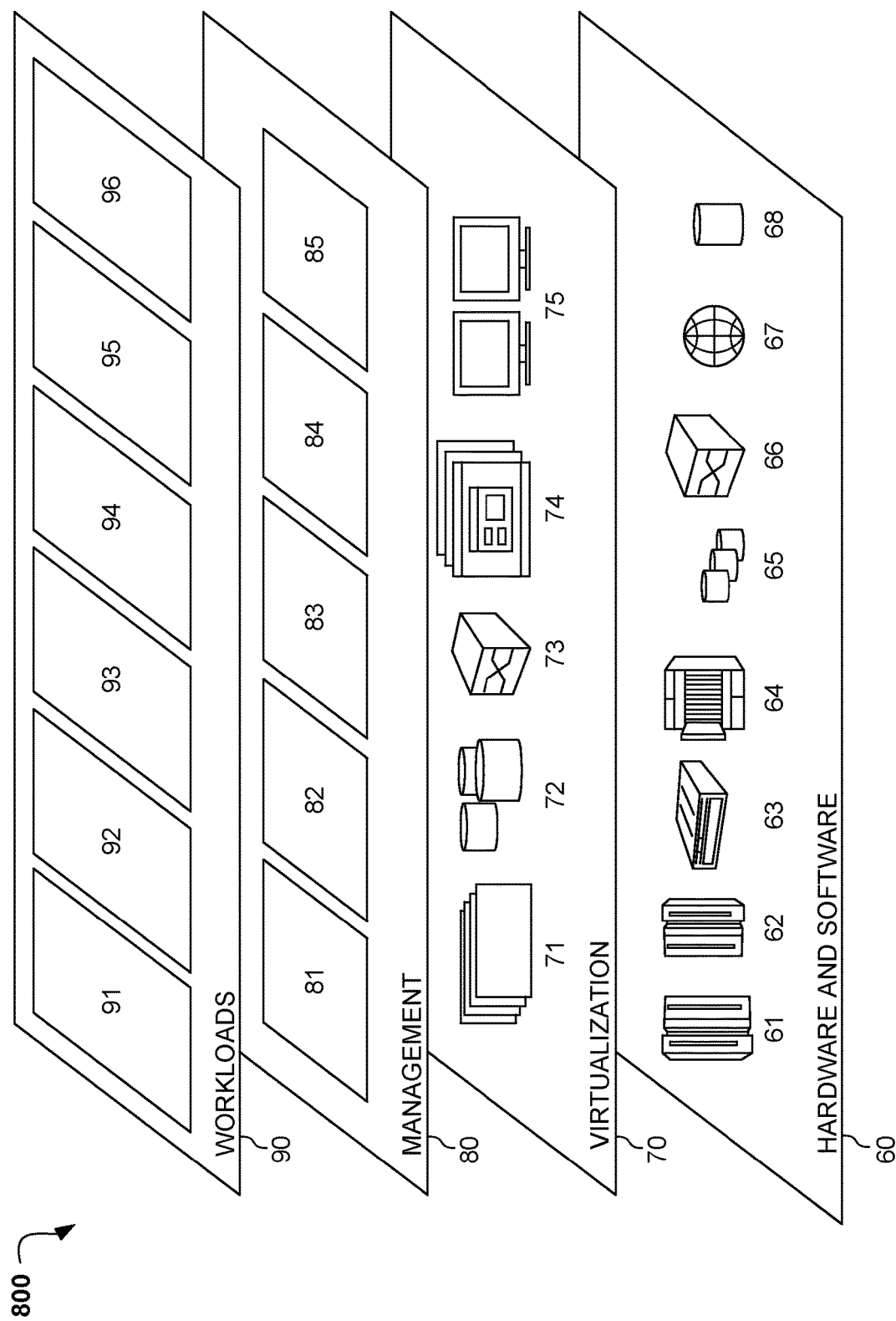
FIG. 8 depicts abstraction model layers according to an embodiment of the present invention.

Referring now to FIG. 8, a set of functional abstraction layers 800 provided by cloud computing environment 50 is shown. It should be understood in advance that the components, layers, and functions shown in FIG. 8 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and tipping prevention 96. Tipping prevention 96 may relate to dynamically monitoring the center of gravity of a load, and modifying the speed or turning radius by which the load is transported to prevent tipover.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A processor-implemented method for preventing tilt or tipover of a load during transport by a vehicle, the method comprising:

retrieving a tipping point of the load, based on a center of gravity of the load, a speed of the vehicle, compression of deformable bodies comprising the load and a foundation, wherein the foundation is disposed between the load and the vehicle, and a turning radius of the vehicle, wherein the tipping point is based on a simulation utilizing finite element analysis; and responsive to determining that the center of gravity of the load is within a threshold distance of the tipping point, taking a corrective action, wherein the corrective action comprises controlling the speed or turning radius of the vehicle.

2. The method of claim 1, wherein the tipping point is based on the unique properties of the vehicle.

3. The method of claim 1, wherein the simulation models interaction between the vehicle, the load, and a foundation.

4. The method of claim 1, further comprising:
monitoring the center of gravity of the load, the speed of the vehicle, and the turning radius of the vehicle in real time.

5. The method of claim 1, wherein the tipping point is based on a simulation utilizing a combination of finite element analysis and multi-body dynamics.

6. The method of claim 1, wherein the simulation utilizes machine learning.

7. A computer system for preventing tilt or tipover of a load during transport by a vehicle, the computer system comprising:

one or more vehicles, one or more sensors, one or more processors, one or more computer-readable memories, one or more computer-readable tangible storage medium, and program instructions stored on at least one of the one or more tangible storage medium for execution by at least one of the one or more processors via at least one of the one or more memories, wherein the computer system is capable of performing a method comprising:

retrieving a tipping point of the load, based on a center of gravity of the load, a speed of the vehicle, compression of deformable bodies comprising the load and a foundation, wherein the foundation is disposed between the load and the vehicle, and a turning radius of the vehicle, wherein the tipping point is based on a simulation utilizing finite element analysis; and responsive to determining that the center of gravity of the load is within a threshold distance of the tipping point, taking a corrective action, wherein the corrective action comprises controlling the speed or turning radius of the vehicle.

8. The computer system of claim 7, wherein the tipping point is based on the unique properties of the vehicle.

9. The computer system of claim 7, wherein the simulation models interaction between the vehicle, the load, and a foundation.

10. The computer system of claim 7, further comprising:
monitoring the center of gravity of the load, the speed of the vehicle, and the turning radius of the vehicle in real time.

11. The computer system of claim 7, wherein the tipping point is based on a simulation utilizing a combination of finite element analysis and multi-body dynamics.

12. The computer system of claim 7, wherein the simulation utilizes machine learning.

13. A computer program product for preventing tilt or tipover of a load during transport by a vehicle, the computer program product comprising:

one or more computer-readable tangible storage medium and program instructions stored on at least one of the one or more tangible storage medium, the program instructions executable by a processor to cause the processor to perform a method comprising:

retrieving a tipping point of the load, based on a center of gravity of the load, a speed of the vehicle, compression of deformable bodies comprising the load and a foundation, wherein the foundation is disposed between the load and the vehicle, and a turning radius of the vehicle, wherein the tipping point is based on a simulation utilizing finite element analysis; and responsive to determining that the center of gravity of the load is within a threshold distance of the tipping point, taking a corrective action, wherein the corrective action comprises controlling the speed or turning radius of the vehicle.

14. The computer program product of claim 13, wherein the tipping point is based on the unique properties of the vehicle.

15. The computer program product of claim 13, wherein the simulation models interaction between the vehicle, the load, and a foundation.

16. The computer program product of claim 13, further comprising:

monitoring the center of gravity of the load, the speed of the vehicle, and the turning radius of the vehicle in real time.

17. The computer program product of claim 13, wherein the tipping point is based on a simulation utilizing a combination of finite element analysis and multi-body dynamics.

* * * * *